(12) United States Patent
Gloudemans

(10) Patent No.: US 8,386,902 B1
(45) Date of Patent: Feb. 26, 2013

(54) METHOD AND APPARATUS FOR RATIONAL PUNCTURING OF FORWARD ERROR CORRECTING CODES

(75) Inventor: Mark A Gloudemans, Fort Wayne, IN (US)

(73) Assignee: Raytheon Company, Waltham, MA (US)

( * ) Notice: Subject to any disclaimer, the term of this patent is extended or adjusted under 35 U.S.C. 154(b) by 397 days.

(21) Appl. No.: 12/639,593

(22) Filed: Dec. 16, 2009

(51) Int. Cl.
*G06F 11/00* (2006.01)

(52) U.S. Cl. ........................................ 714/800

(58) Field of Classification Search ............... 714/800, 714/804
See application file for complete search history.

(56) References Cited

U.S. PATENT DOCUMENTS

| | | | | |
|---|---|---|---|---|
| 2003/0133497 A1* | 7/2003 | Kinjo et al. | ............ | 375/152 |
| 2008/0178064 A1* | 7/2008 | Kim et al. | ............ | 714/790 |
| 2008/0307293 A1* | 12/2008 | Cheng | ............ | 714/790 |
| 2010/0199145 A1* | 8/2010 | Kang et al. | ............ | 714/758 |
| 2010/0235722 A1* | 9/2010 | Lin | ............ | 714/790 |

* cited by examiner

*Primary Examiner* — Scott Baderman
*Assistant Examiner* — Neil Miles
(74) *Attorney, Agent, or Firm* — Lando & Anastasi, LLP

(57) ABSTRACT

A method and apparatus to select bits for puncturing forward error correcting code frames to synthesize higher code rates. For example, there is provided a method of puncturing a digital data stream that includes a first parity bit stream and a second parity bit stream to generate a punctured bit stream. In one example, the method includes operating a first counting loop to select a first number of punctured bits from the first parity bit stream, comparing the first number of punctured bits with a desired number of bits for the punctured bit stream, and if the first number of punctured bits is less than the desired number of bits, operating a second counting loop to select a second number of punctured bits from the second parity bit stream until the sum of the first number of punctured bits and the second number of punctured bits is equal to the desired number of bits for the punctured bit stream.

14 Claims, 7 Drawing Sheets

METHOD AND APPARATUS FOR RATIONAL PUNCTURING OF FORWARD ERROR CORRECTING CODES

BACKGROUND

1. Field of the Invention

The present invention relates generally to signal processing and, more particularly, to systems and methods employing forward error correcting codes.

2. Discussion of Related Art

Forward error correcting codes are used to increase the reliability of digital transmissions. An (n,k) error correcting code produces n output bits given k input bits at a code rate of R=k/n. It is often desirable to increase the code rate to increase the rate of transmission. The code rate can be increased by removing m of every n bits from the output stream, thus producing a code rate R'=k/(n−m). This process of erasing m of n output bits, known as code puncturing, increases the code rate, but reduces the error correcting capacity of the code.

In general, the puncturing process (erasure pattern) is closely tied to the correction code being used as not all erasure patterns work well with all codes. Thus, the conventional approach to puncturing is to define a small, fixed, periodic puncturing pattern (algorithm) for each desired code rate. For example, there are several known puncturing algorithms available for the WiMax Convolutional Turbo Code (CTC) for forward error correction. An alternative approach is to interleave the n output bits with a pseudorandom interleaver and then transmit only the first n-m bits of the interleaved output. However, this approach is relatively complicated and resource intensive.

SUMMARY OF INVENTION

Aspects and embodiments are directed to low-complexity systems and methods to select bits for puncturing forward error correcting code stream to synthesize higher code rates. The techniques are generally applicable to systems employing forward error correction, which include a wide variety of systems designed to reliably communicate or store digital information, such as, for example, cellular telephone systems, wireless digital communication networks, hard disk drives, etc. According to one embodiment, a method uses a conditional counting algorithm to select n-m bits from an n-bit frame for transmission. This technique allows parametric description of the puncturing procedure for any rational code rate compatible with a block size of n, as discussed further below. Embodiments of the methods may be applied to many different forward error correcting codes, including, for example, the WiMax convolutional Turbo Code, as discussed further below.

One embodiment is directed to a processor-implemented method of puncturing a digital data stream to generate an output punctured bit stream, the digital data stream comprising a first parity bit stream and a second parity bit stream, each of the first and second parity bit streams consisting of K bits. The method comprises steps of selecting up to K bits from the first parity bit stream to provide a first selected number of bits, determining whether the first selected number of bits is less than a predetermined desired number of bits for the output punctured bit stream, and selecting, responsive to a determination that the first selected number of bits is less than the predetermined desired number of bits, a second selected number of bits from the second parity bit stream such that a sum of the first selected number of bits and the second selected number of bits is equal to the predetermined desired number of bits for the output punctured bit stream.

In one example of the method, the step of selecting up to K bits from the first parity bit stream includes operating a first counting loop to select the first selected number of bits from the first parity bit stream. In another example, operating the first counting loop includes defining a first number of bits desired to be selected from the first parity bit stream as the lesser of K and the predetermined desired number of bits for the output punctured bit stream, selecting a first bit from the first parity bit stream, incrementing a counter by a counter step value equal to the first number of bits to set a counter value, based on the counter value, selecting another bit from the first parity bit stream, decrementing the counter by K, and repeating the steps of incrementing the counter, selecting another bit from the first parity bit stream, and decrementing the counter, until the first selected number of bits is equal to the lesser of K and the predetermined desired number of bits for the output punctured bit stream. In another example, selecting the second selected number of bits includes operating a second counting loop to select the second selected number of bits from the second parity bit stream.

Another embodiment is directed to a processor-implemented method of puncturing a coded digital data stream comprising a first parity bit stream and a second parity bit stream to generate an output punctured bit stream, the first and second parity bit streams each consisting of K bits and the output punctured bit stream consisting of N-K bits. The method comprises receiving the first and second parity bit streams, operating a first counting loop to select a first number of selected bits from the first parity bit stream, the first number of selected bits being the lesser of K and N-K, determining whether the first number of selected bits is less than N-K, responsive to a determination that the first number of selected bits is less than N-K, operating a second counting loop to select a second number of selected bits from the second parity bit stream until the sum of the first number of selected bits and the second number of selected bits is equal to N-K, and transmitting the output punctured bit stream.

In one example of the method, operating the first counting loop includes initializing the first counting loop with a first counter value, defining a first counter step value equal to the lesser of K and N-K, incrementing the first counter value by the first counter step value to set an incremented counter value, based on the incremented counter value, selecting a parity bit from the first parity bit stream, decrementing the first counter by K, and repeating the steps of incrementing the first counter, selecting the parity bit, and decrementing the first counter, to select the first number of selected bits. In another example, initializing the first counting loop includes initializing the first counting loop with the first counter value equal to zero. In another example, operating the second counting loop includes initializing the second counting loop with a second counter value, defining a second counter step value equal to the difference between N-K and the first number of selected bits, incrementing the second counter value by the second counter step value to set a second incremented counter value, based on the second incremented counter value, selecting a parity bit from the second parity bit stream, decrementing the second counter by K, and repeating the steps of incrementing the second counter, selecting the parity bit, and decrementing the second counter to select the second number of selected bits. In one example, initializing the second counting loop includes initializing the second counting loop with the second counter value equal to zero.

According to another embodiment, a processor-implemented method of generating a forward error corrected punctured digital data stream comprises receiving an input bit stream, encoding the input bit stream using a forward error correcting encoder to generate a coded bit stream, the coded bit stream comprising a first parity bit stream, a second parity bit stream, and a systematic bit stream, operating a first counting loop to puncture the first parity bit stream to generate a first punctured parity bit stream, comparing a first number of parity bits in the first punctured parity bit stream with a desired number of parity bits for the forward error corrected punctured digital data stream, responsive to the first number of parity bits being les than the desired number of bits, operating a second counting loop to puncture the second parity bit stream to generate a second punctured parity bit stream having a second number of parity bits equal to the difference between the desired number of parity bits and the first number of parity bits, combining the systematic bit stream, the first punctured parity bit stream and second punctured parity bit stream to generate the forward error corrected punctured digital data stream, and transmitting the forward error corrected punctured digital data stream.

In one example of the method, operating the first counting loop includes initializing the first counting loop with a first counter value, defining a first counter step value equal to the lesser of the number of bits in the first parity bit stream and the desired number of parity bits for the forward error corrected punctured digital data stream, incrementing the first counter value by the first counter step value, based on the first counter value, selecting a parity bit from the first parity bit stream, decrementing the first counter by the number of bits in the first parity bit stream, and repeating the steps of incrementing the first counter, selecting the parity bit, and decrementing the first counter, to select the first number of parity bits and generate the first punctured parity bit stream. In another example, operating the second counting loop includes initializing the second counting loop with a second counter value, defining a second counter step value equal to the equal to the difference between the desired number of parity bits for the forward error corrected punctured digital data stream and the first number of parity bits, incrementing the second counter value by the second counter step value, based on the second counter value, selecting a parity bit from the second parity bit stream, decrementing the second counter by the number of bits in the second parity bit stream, and repeating the steps of incrementing the second counter, selecting the parity bit, and decrementing the second counter, to select the number of parity bits and generate the second punctured parity bit stream. In one example, initializing the first counting loop includes initializing the first counting loop with the first counter value equal to zero. In another example, initializing the second counting loop includes initializing the second counting loop with the second counter value equal to zero.

According to another embodiment, a forward error correcting encoder comprises a turbo encoder having an input configured to receive an input bit stream consisting of K bits, the turbo encoder being configured to encode the input bit stream to produce a coded bit stream comprising a systematic bit stream consisting of K bits, a first parity bit stream consisting of K bits and a second parity bit stream consisting of K bits, K being an integer, and a puncturing apparatus coupled to the turbo encoder and configured to receive at the first and second parity bit streams and to execute a puncturing algorithm to produce a punctured parity bit stream consisting of N-K bits, N being an integer greater than K, the puncturing algorithm comprising a conditional counting loop that selects a first number of selected bits equal to the lesser of K and N-K bits from the first parity bit stream and, if the first number of selected bits is less than N-K, selects a remaining number of selected bits from the second parity stream to generate the punctured parity bit stream consisting of N-K bits.

The forward error correcting encoder may further comprise a coded bit stream formation apparatus configured to combine the systematic bit stream with the punctured parity bit stream to generate an output punctured coded bit stream for transmission. In one example, the forward error correcting encoder is implemented as a field programmable gate array. In another example, the puncturing apparatus is further configured to execute the puncturing algorithm which comprising steps of setting a first counter value to zero, defining a first counter step value equal to the lesser of K and N-K, incrementing the first counter value by the first counter step value to set a first incremented counter value, and based on the first incremented counter value, selecting a parity bit from the first parity bit stream. The puncturing algorithm further comprises steps of decrementing the first counter by K, and repeating the steps of incrementing the first counter, selecting a parity bit from the first parity bit stream, and decrementing the first counter until the first number of selected bits is equal to the lesser of K and N-K bits. The puncturing algorithm further comprises steps of determining whether the first number of selected bits is less than N-K, responsive to a determination that the first number of selected bits is less than N-K, performing steps of setting a second counter value to zero, defining a second counter step value equal to the difference between N-K and the first number of selected bits, incrementing the second counter value by the second counter step value to set a second incremented counter value, based on the second incremented counter value, selecting a parity bit from the second parity bit stream, decrementing the second counter by K, and repeating the steps of incrementing the second counter, selecting a parity bit from the second parity bit stream, and decrementing the second counter until the sum of the first number of selected bits and the remaining number of selected bits is equal to N-K.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with at least one of the objectives, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. Where technical features in the figures, detailed description or any claim are followed by references signs, the reference signs have been included for the sole purpose of increasing the intelligibility of the figures, detailed description, and/or claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. In the figures:

DETAILED DESCRIPTION

Aspects and embodiments are directed to systems and methods for puncturing forward error correcting code frames to synthesize higher code rates. As discussed above, forward error correction is used in a wide variety of digital communications and/or storage applications to improve the reliability and/or robustness of the digital transmission. There are various types of forward error correcting coders, including convolutional coders and systematic block coders, each of which implement a wide variety of codes. For example, the IEEE 802.16e MobileWiMax standard specifies a Turbo Code algorithm as an optional forward error correcting component. Embodiments of the puncturing techniques discussed herein may be applied to convolutional and/or block coders, including the MobileWiMax Convolutional Turbo Coder.

According to one embodiment, a conditional counting algorithm is used to select (n-m) bits from an n-bit packet stream for transmission. Thus, m bits are "erased" from the stream during the puncturing process. Embodiments of the puncturing technique allow parametric description of the puncturing algorithm for any rational code rate compatible with a block size of n, as discussed further below.

It is to be appreciated that embodiments of the methods and apparatus discussed herein are not limited in application to the details of construction and the arrangement of components set forth in the following description or illustrated in the accompanying figures. The methods and apparatus are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
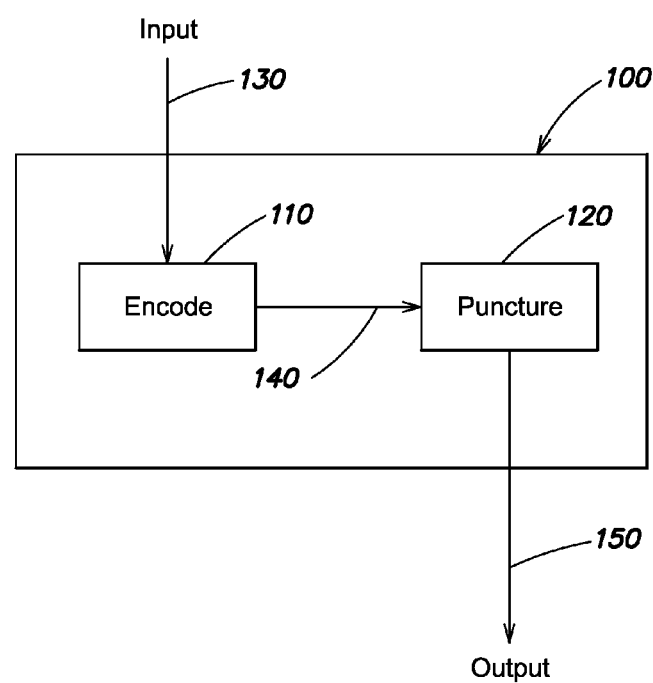
FIG. 1 is a block diagram of one example of a forward error correcting encoder according to aspects of the invention.

Referring to FIG. 1, there is illustrated a block diagram of one example of a forward error correcting (FEC) encoder 100 according to one embodiment. The FEC encoder 100 comprises an encoder 110 and a puncturing component 120. The encoder 110 receives an input bit stream 130, encodes the input bit stream (as discussed further below) to provide a coded bit stream 140 which is punctured by the puncturing component 120 which provides a coded, punctured output stream 150. In one embodiment, the FEC encoder 100 is a turbo encoder and uses a turbo code standard, such as the Commercial WiMax (802.16e) Turbo Code Standard. The FEC encoder 100 may be implemented, for example, using a field programmable gate array (FPGA) such as a VIRTEX 5 commercial FPGA produced by the Xilinx Corporation. As will be appreciated by those skilled in the art, the FPGA may also include other components of the system in which the FEC encoder 100 is used in addition to the FEC encoder itself.

Data transmissions are often divided into packets of data, which are in turn divided into frames, as known to those skilled in the art. Accordingly, in one example, forward erroring correcting and puncturing is performed on a per-frame basis, and the input bit stream 130 corresponds to a given frame of a data transmission. The frames within a given data packet may have the same or different frame sizes. In one example, all frames with a given frame size within a single packet operate at the same punctured code rate. It is to be appreciated however, that embodiments of the puncturing algorithms discussed below may be applied to packets comprising frames of any number of different frame sizes, and that the frames in a packet may be punctured at the same or different punctured code rates.

According to the Commercial WiMax (802.16e) Turbo Code Standard, the operation of the turbo encoder is defined for the frame sizes listed in Table 1 below. In Table 1, bolded cells denote frame sizes that are not integer multiples of 16 bits. In some examples, the frame sizes are limited to integer multiples of 16 bits to accommodate networking layer preferences.

TABLE 1

Allowable WiMax TurboCode Frame Sizes (bits)

| 48 | 72 | 96 | 144 | 192 | 216 | 240 | 288 | 360 | 384 | 432 | |
|----|----|----|-----|-----|-----|-----|-----|-----|-----|-----|------|
| 480 | | 960 | | 1920 | | | 2880 | | 3840 | | 4800 |

As discussed above, the code rate is defined as the ratio of uncoded bits to coded bits. Thus, for the WiMax Turbo Code Standard, the basis code rate is ⅓ because the encoder 110 produces three coded bits for each uncoded bit in the input bit stream 130. According to one embodiment, the code rate is increased for the turbo code by removing some bits from the coded bit stream 140. This process, known as puncturing, reduces the error correction performance of the code but allows synthesis of punctured code rates between the basis rate (e.g., ⅓ for the WiMax turbo code) and 1. A puncturing algorithm may be used to remove selected bits from the coded bit stream 140 to produce the desired punctured code rate. Different puncturing algorithms may result in different error correction performance. One embodiment uses a counter-based puncturing algorithm that allows the synthesis of arbitrary punctured code rates as the best balance between performance and complexity. The puncturing algorithm may be implemented by the puncturing component 120.

Still referring to FIG. 1, the encoder 110 may be a block coder or a convolutional coder. Both block codes and convolutional codes may be systematic or non-systematic. Embodiments of the puncturing algorithm implemented by the puncturing component 120 may be applied to systematic or non-systematic block or convolutional codes. For systematic codes, the encoder 110 produces a certain number of coded bits that are duplicates of the input bits 130 (these bits are called the systematic bits), and a certain additional number of coded bits called parity bits. In the case of a non-systematic block coder, the puncturing algorithm may be applied to all the bits produced by the encoder 110, namely to the entire coded bit stream 140. A convolutional coder may produce one or more parity bit streams and, in the case of a systematic convolutional coder, one of the bit streams is a systematic bit stream (i.e., a copy of the input bits). In one embodiment, in the case of a systematic coder, the puncturing algorithm is applied to one or more of the parity bit stream(s) so as not to corrupt the data contained in the systematic bit stream.

Figure 2:
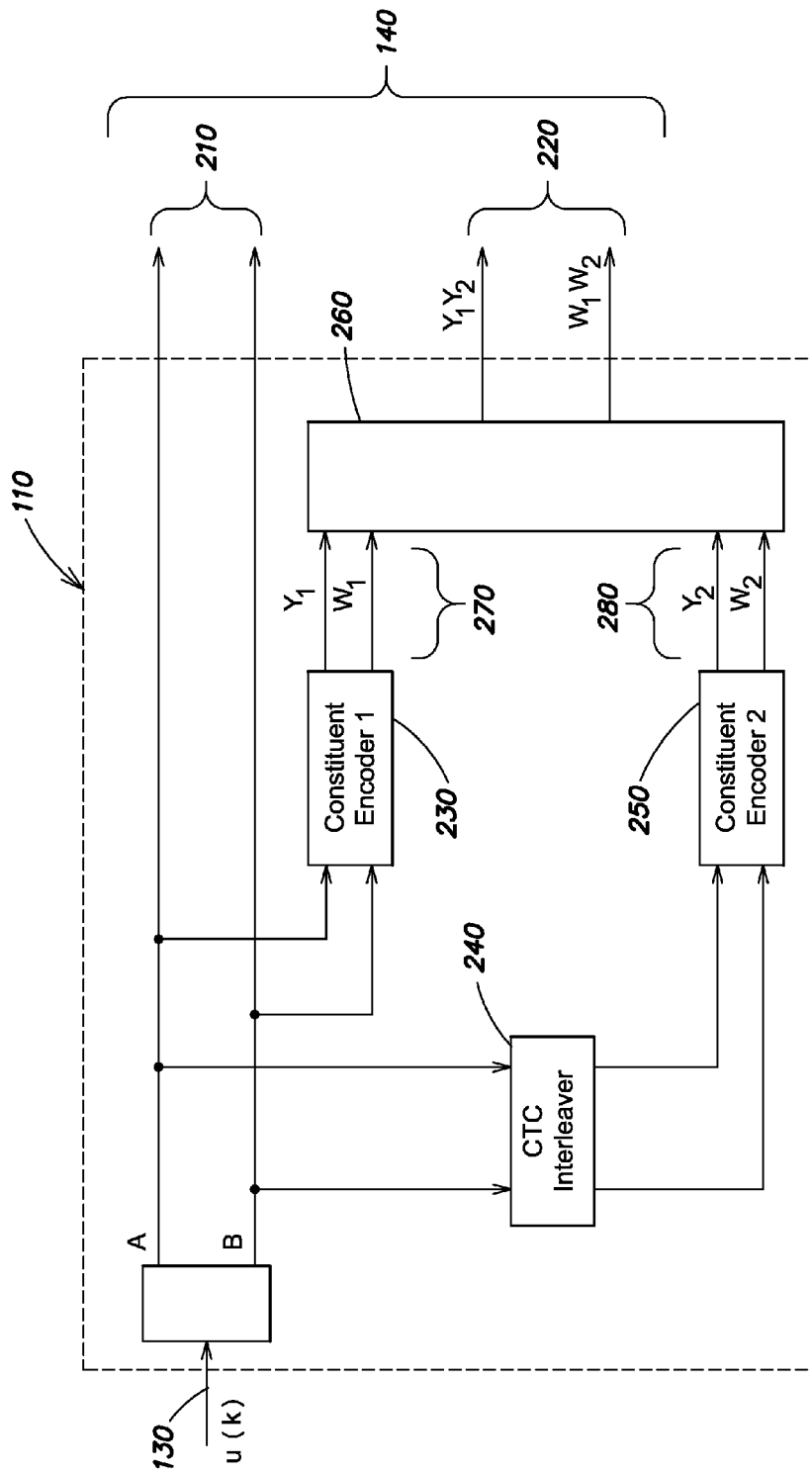
FIG. 2 is a block diagram of one example of an encoder according to aspects of the invention.

As discussed above, in one example, the FEC encoder 100 is a turbo encoder implementing the WiMax Turbo Code Standard. Referring to FIG. 2, there is illustrated a block diagram of one example of the encoder 110 for implementing the WiMax Turbo Code Standard. The input bit stream 130, which comprises K bits, is split into even and odd samples A and B, each of length K/2 bits. For the WiMax Turbo Code Standard, one third of the coded bits 140 produced by the encoder 110 are duplicates of the uncoded input bits 130. These duplicates are called the systematic bits 210 of the turbo code and are passed to the output of the encoder 110. The remaining two thirds of the coded bits 140 are the parity bits 220 (2K bits), and these comprise two distinct subsets referred to herein as the "Y" parity bit stream (of length K bits) and the "W" parity bit stream (of length K bits). In one example, to generate the parity bits, the input bit stream 130 is fed to a first constituent encoder 230 which encodes the bit stream using tail biting duobinary convolutional constituent code to produce a first set of parity bits 270 comprising pairs of parity bits Y1,W1, as shown in FIG. 2. The bits of a second parity bit set 280 are produced in pairs Y2,W2, by first interleaving the uncoded bits A,B using a pseudorandom interleaver 240 and then encoding the bits with a second constituent encoder 250 using the same tail biting duobinary convolutional constituent code. In order to produce good forward error correcting performance, the application of rational rate puncturing to the WiMax turbo code, by puncturing component 120, preferably operates on parity bits coming from both the interleaved (Y2,W2) and non-interleaved (Y1,W1) encode processes. Accordingly, the pairs of parity bits Y1,W1 and Y2,W2 are fed to component 260 which assembles the "Y" parity bit stream by taking the "Y" bits (Y1 and Y2) from each of the first (non-interleaved) and second (interleaved) bit sets 270, 280, and assembles the "W" parity bit stream by taking the "W" bits (W1,W2) from each of the two parity bit sets. According to one embodiment, the code rate is increased for the turbo code by removing some parity bits 220 from the coded bit stream 140 and marking these as "erasures" for the turbo decoder, as discussed further below.

Figure 3:
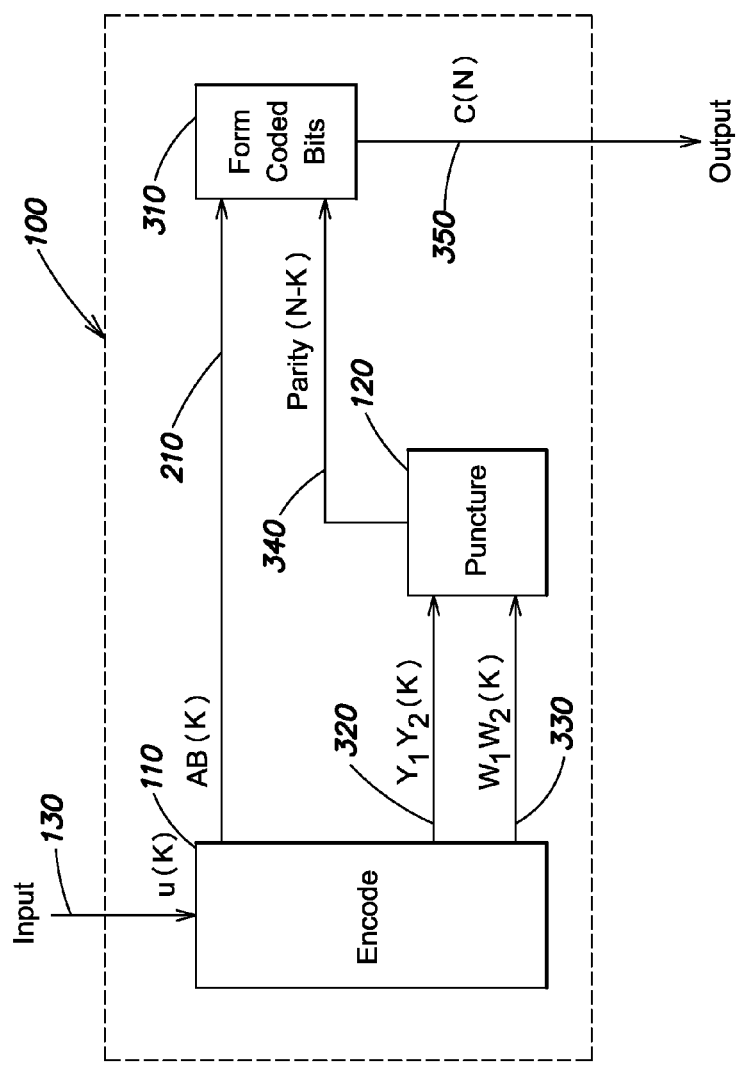
FIG. 3 is a block diagram of one example of an encoding process and apparatus according to aspects of the invention.

Referring to FIG. 3, there is illustrated a block diagram of one example of an FEC encode process for a WiMax Turbo Encoder 100 according to one embodiment. The FEC encoder 110 receives the uncoded bit stream 130 which includes K bits, K being an integer greater than or equal to one. In one example, k is restricted to the values given in Table 1, optionally, to those values that are integer multiples of 16. The FEC encoder 100 operates to encode, as discussed above, and puncture the K bits of the input bit stream 130 to generate an output bit stream having N bits, where N is the coded bit capacity for the frame. In one example, the encoder 110 is a turbo encoder operating according to the WiMax (802.16e) Turbo Code Standard, and thus produces three coded bits for each uncoded bit of the uncoded bit stream 130. As discussed above, one third of the coded bits are duplicates of the uncoded bits and these K systematic bits 210 are passed from the encoder 110 to a coded bit stream formation block 310. The remaining two thirds of the coded bits (2K bits) from the encoder 110 are the parity bits 220 discussed above. The parity bits are split into two parity bit steams, the "Y" parity bit stream 320 and the "W" parity bit stream 330, each comprising K bits, and fed to the puncturing component 120. The parity bit streams 320, 330 are punctured by the puncturing component 120 to form an integrated punctured parity bit set 340 which comprises N-K bits, where N is the number of coded bits for the output bit stream 350. Thus, by controlling the puncturing component 120 to select a desired puncturing rate, the FEC encoder 100 may support any arbitrary punctured code rate, from ⅓ (no puncturing) to 1 (complete erasure of all parity bits). In one presently preferred example, the punctured code rate is selected to be approximately 0.75±5%.

Figure 4:
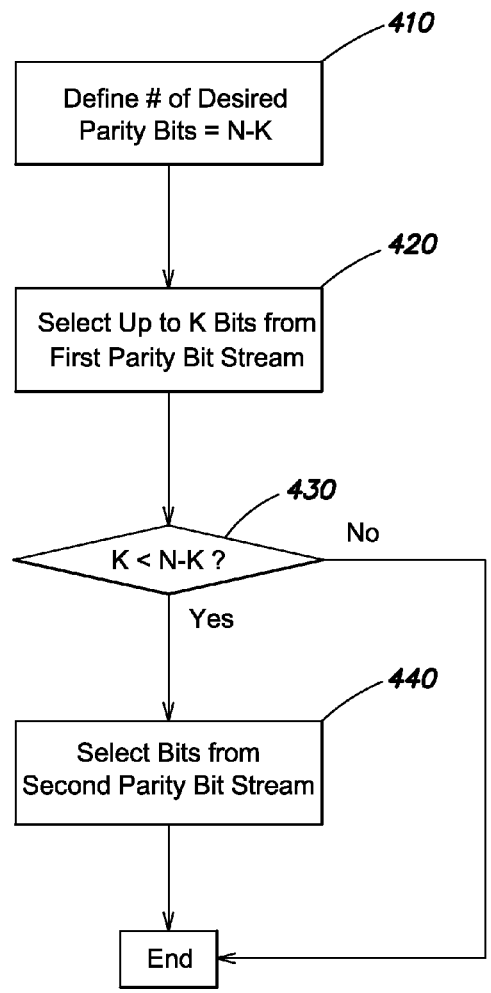
FIG. 4 is a flow diagram of one example of a puncturing method according to aspects of the invention.

According to one embodiment, the puncturing component 120 implements a puncturing algorithm that selects which of the parity bits, in streams 320 and 330, to forward to the coded bit stream formation block 310 and which to remove. In one example, the puncturing algorithm is a counting algorithm that uniformly selects (K-m) bits from the parity bit streams 320, 330 for transmission to the coded bit stream formation block 310. Referring to FIG. 4, there is illustrated a flow diagram of one example of a puncturing algorithm. According to one embodiment, in a first step 410, the algorithm defines the number of parity required to be N-K bits. The algorithm then uses a counter to select up to K bits from one of the two parity streams 320 or 330 (step 420). If N-K is less than K, then the algorithm selects all N-K bits from the first parity stream 320 or 330. If more than K bits are required to reach N-K bits (determination 430), the algorithm then selects the remaining bits from the second parity bit stream 320 or 330 (step 440). In one example, the algorithm selects up to K bits first from the "Y" parity bit stream 320 and them, if required, selects the remaining bits from the "W" parity bit stream to reach the desired total N-K parity bits.

One example of the puncturing algorithm may be defined as the following MATLAB™ function:

function *ia*PuncturedBits=PunctureFrame(*ia*Y,*ia*W,*iK*, *iN*)  (a1)

*i*ParityBitsRequired=*iN*−*iK*;  (a2)

*ia*PuncturedBits=zeros(*i*ParityBitsRequired,1);  (a3)

*i*ParityBitsY=min(*i*ParityBitsRequired,*iK*);  (a4)

*i*ParityBitsW=*i*ParityBitsRequired−*i*ParityBitsY;  (a5)

*i*PuncturedBit=1;  (a6)

*i*Count=0;  (a7)

for *i*ParityBit=1:*iK*  (a8)

*i*Count=*i*Count+*i*ParityBitsY;  (a9)

```
if(iCount>=1K)                                    (a10)

iaPuncturedBits(iPuncturedBit)=iaY(iParityBit);   (a11)

iCount=iCount-iK;                                 (a12)

iPuncturedBit=iPuncturedBit+1;                    (a13)

end                                               (a14)

end                                               (a15)

iCount=0;                                         (a16)

for iParityBit=1:iK                               (a17)

iCount=iCount+iParityBitsW;                       (a18)

if(iCount>=1K)                                    (a19)

iaPuncturedBits(iPuncturedBit)=iaW(iParityBit);   (a20)

iCount=iCount-iK;                                 (a21)

iPuncturedBit=iPuncturedBit+1;                    (a22)

end                                               (a23)

end                                               (a24)
```

Figure 5:
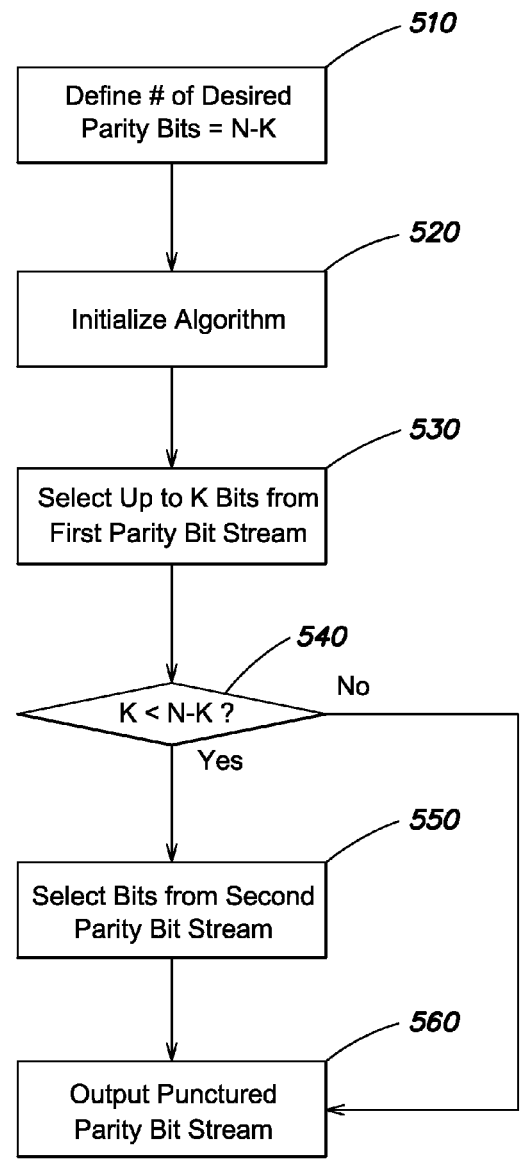
FIG. 5 is a flow diagram of another example of a puncturing method according to aspects of the invention.

A flow diagram corresponding to the above function is illustrated in FIG. 5. In the above function, line (a1) names the function, and line (a2) defines the number of parity bits required for transmission (step 510) to be N-K bits. Line (a3) declares an array to hold the selected parity bits for transmission to the coded bit stream formation block 310. In one example, the algorithm first selects up to K bits from the "Y" parity bit stream 320 and then, if more bits are required, selects the additional bits from the "W" parity bit stream 330 to reach N-K bits. Accordingly, line 4 defines a variable, iParityBitsY, to be the smaller of the number of parity bits required and the number of uncoded bits in the frame (K). Line (a5) defines a second variable, iParityBitsW, as the difference between the number of parity bits required and the number of bits selected from the Y parity stream 355. Lines (a3) to (a6) correspond to initializing the algorithm, step 520 in FIG. 5. Lines (a7) to (a15) define a first counting loop that selects up to K bits from the Y parity bit stream 320 (step 530). In one example, this counting loop will output a number of bits equal to iParityBitsY. If the number of bits selected from the Y parity bit stream 320 is less than the number of parity bits desired (step 540), the algorithm selects the remaining bits from the W parity bit stream 330. Thus, lines (a16) to (a24) define a second counting loop to uniformly select bits from the W parity bit stream 330 (step 550). The selected parity bits (from the Y parity bit stream 320 and, if necessary also the W parity bit stream 330), are transmitted to the coded bit stream formation block 310 (step 560). The coded bit stream formation block 310 receives the systematic bit stream 210 (K bits) and the punctured parity bit stream (N-K bits) and adds them, for example, by concatenation or interleaving) to generate the coded bit stream 350 (N bits).

In limited waveform level simulations, this technique appears to out-perform the interleaver-based variable rate puncturing algorithm specified by the WiMax (802.16e) Turbo Code Standard by about 0.5 to 1.0 dB.

It will be appreciated by those skilled in the art, given the benefit of this disclosure, that numerous variations on the above function/algorithm are possible. For example, the algorithm may be set up to first select bits from the W parity bit stream 330 and then, if additional parity bits are required, select the additional bits from the Y parity bit stream 320. For the WiMax turbo code discussed above, it is important that one set of parity bits, either the Y parity bit stream 320 or the W parity bit stream 330 be exhausted before using any bits from the other set. This is because the Y parity bit stream 320 and the W parity bit stream 330 uniformly blend bits from both the interleaved and the non-interleaved constituent parity codes, as discussed above with reference to FIG. 2. Accordingly, taking some bits from the Y parity bit stream 320 and some bits from the W parity bit steam 330 risks accessing a majority of bits from one of the constituent codes (i.e., interleaved or non-interleaved), and thereby degrading the error correcting performance. However, for other types of codes, or in an example where the two parity bit streams used for puncturing are the non-interleaved bit set 270 and the interleaved bit set 280, the algorithm may be configured to select bits evenly/alternately from both parity bit streams, for example 270 and 280, rather than preferentially or initially from one stream.

In another example, in the instance where the encoder 110 generates only a single parity bit stream, rather than two streams 320, 330, the algorithm may be modified, for example, to include only one counting loop since all the parity bits will be selected from the single parity bit stream. Similarly, if the encoder 110 generates more than two parity bit streams, the puncturing algorithm may be modified to select parity bits from any or all of the parity bit streams generated by the encoder 110, provided that the algorithm is configured to select bits from each constituent code used to generate the parity bits. In addition, as discussed above, for non-systematic coders, the puncturing algorithm may be applied to the entire bit stream. In this instance, the modification to the puncturing algorithm may be similar as that for a system in which only one parity bit stream is used.

The above-described example puncturing algorithm was applied to a systematic block coder; however, those skilled in the art will recognize, given the benefit of this disclosure, that the algorithm can readily be generalized for operation with convolutional and non-systematic codes, as discussed above. For example, referring again to FIG. 1, the input to the puncturing component 120 may include the entire coded bit stream 140 from the encoder 110, and the output punctured coded bit stream 340 may include N of every K input bits. One example of a generalized puncturing algorithm may be defined as the following MATLAB™ function:

```
function iaOutputBits=Puncture(iaInputBits,iK,iN)   (b1)

iOutputBit=1;                                       (b2)

iInputBits=length(iaInputBits);                     (b3)

iOutputBits=floor(iInputBits*iK/iN);                (b4)

iaOutputBits=zeros(iOutputBits,1);                  (b5)

iCount=0;                                           (b6)

for iInputBit=1:iInputBits                          (b7)

iCount=iCount+1K;                                   (b8)

if(iCount>=1N)                                      (b9)

iaOutputBits(iOutputBit)=iaInputBits(iInputBit);    (b10)

iCount=iCount-iN;                                   (b11)
``` iOutputBit=iOutputBit+1; (b12)

end (b13)

end (b14)

In the above example algorithm, line (b1) names the function, and lines (b2) to (b6) initialize the variables. Lines (b7) to (b14) define a counting algorithm to select the output bits to form the punctured coded bit stream 340, similarly to the previous example discussed above.

Figure 6:
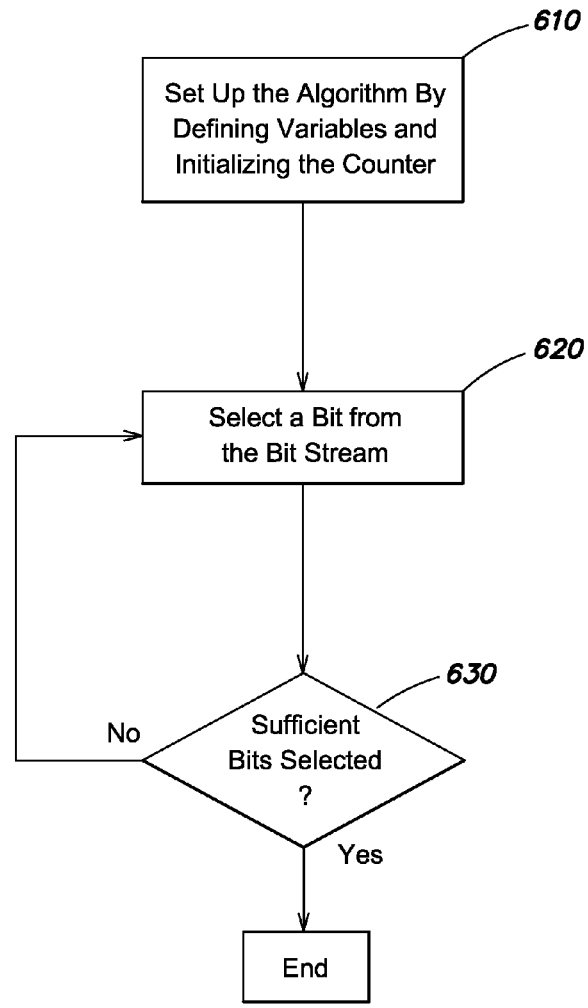
FIG. 6 is a flow diagram of another example of a puncturing method according to aspects of the invention.

A flow diagram of one example of a generalized puncturing method, corresponding at least in part to the above function, is illustrated in FIG. 6. In a first step 610, the algorithm defines the variables and initializes the counter, corresponding, for example, to lines (b2) to (b6). In step 620, a bit is selected from the input bit stream to be added to the output bit stream. In one example, this selection includes incrementing the counter by a specified amount (e.g., as shown in lines (b8)-(b10)), and selecting the bit at the bit position in the input bit stream corresponding to the counter value. If sufficient bits have been selected for the output bit stream (step 630), for example, if the current frame of the output bit stream has the correct number of bits for the desired frame size, the algorithm ends. Otherwise, the counter is incremented, and step 620 is repeated to select another bit. The process may repeat until the desired punctured code rate is achieved.

Figure 7:
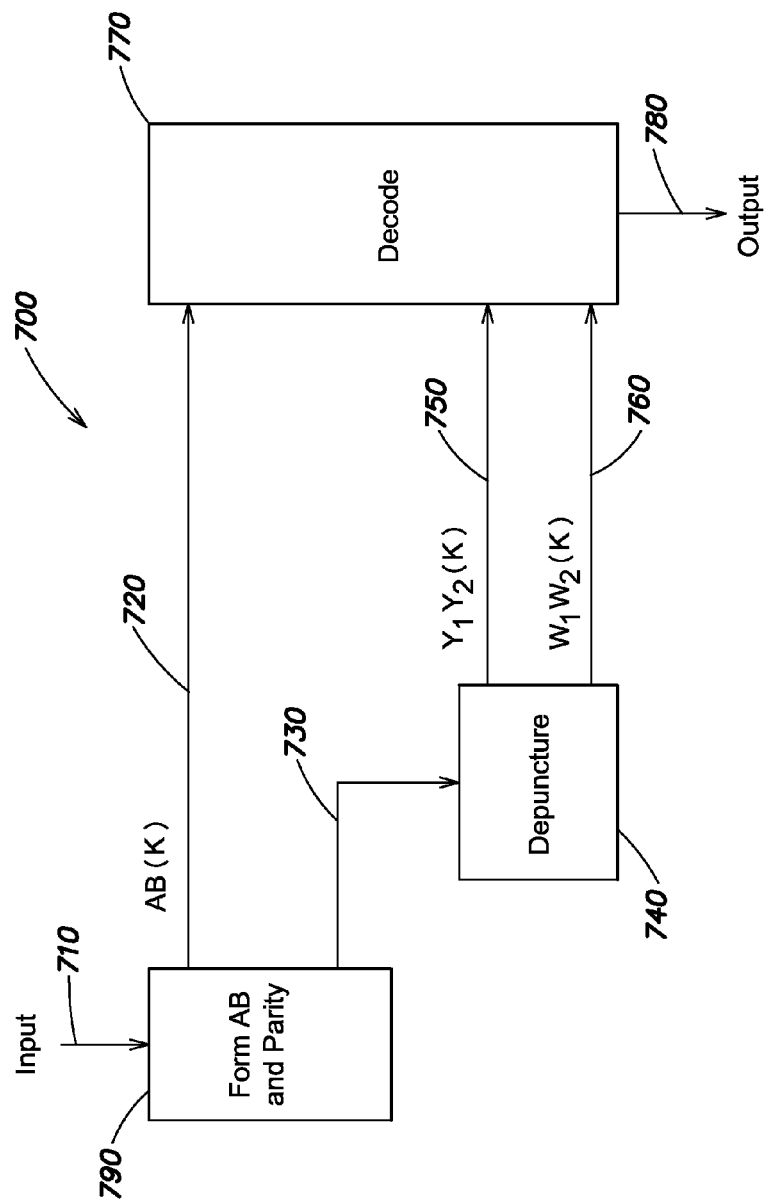
FIG. 7 is a block diagram of one example of a decoding process and apparatus according to aspects of the invention.

According to one embodiment, an FEC decoder is used to decode the packets of a received data stream. FIG. 7 illustrates a block diagram of one example of the FEC decoding of a frame of a data packet for the WiMax Turbo Code Standard. In one embodiment, the decoding process is essentially the reverse of the turbo encoding process discussed above with reference to FIG. 3. Encoded data is typically modulated and transmitted over a channel, then demodulated and decoded at a receive. The combination of the transmitter, channel and receiver generally results in some form of signal degradation. Accordingly, in one example, the FEC decoder 700 operates primarily on "soft decision" values rather than on hard bit values (0's or 1's). A soft decision value is a log likelihood ratio that effectively describes the weight of evidence for a binary zero as a negative value and the weight of evidence for a binary one as a positive value. In one example, the input data 710 to the FEC decoder 700 is in the form of log likelihood ratios on each coded bit. The receiver chain may typically include a demodulator and log likelihood ratio pre-processor that uses the output symbols from the demodulator, in combination with knowledge of the modulation scheme, to generate the log likelihood ratios used to drive the FEC decoder 700. In one example, the log likelihood ratios are four-bit signed numbers; however, those skilled in the art will recognize that numerous variations may be implemented.

Referring to FIG. 7, the input data stream 710 is processed by block 790 which partitions the received coded bit stream 710 into the K systematic soft decision bits (stream 720) and the (N-K) parity soft decisions bits (stream 730). The streams 720 and 730 correspond to the streams 210 and 340, respectively, in the FEC encoder 100, except that, in at least one example, the bits streams 720 and 730 include soft decision bits rather than hard bits. The parity bit stream 730 is provided to a depuncturing block 740 that applies a depuncturing algorithm to produce the two parity bit streams 750, 760, corresponding to the original Y and W parity bit streams 320, 330 in the FEC encoder 100. The systematic bits 720 and the parity bits 750, 760 are provided to a decoder 770 which reconstructs an uncoded bit stream (of K bits) 780 for each frame.

One example of a depuncturing algorithm implemented by the depuncturing block 740 is described by the following MATLAB™ function:

function[iaDepuncturedY,iaDepuncturedW]= (c1)

DepunctureFrame(oModem,iaPuncturedSoftParity,iK, iN) (c2)

iParityBitsRequired=iN-iK; (c3)

iParityBitsY=min(iParityBitsRequired,iK); (c4)

iParityBitsW=iParityBitsRequired-iParityBitsY; (c5)

iaDepuncturedY=zeros(iK,1); (c6)

iaDepuncturedW=zeros(iK,1); (c7)

iCount=0; (c8)

iPuncturedBit=1; (c9)

for iParityBit=1:iK (c10)

iCount=iCount+iParityBitsY; (c11)

if(iCount>=1K) (c12)

iaDepuncturedY(iParityBit)=iaPuncturedSoftParity (iPuncturedBit); (c13)

iCount=iCount-iK; (c14)

iPuncturedBit=iPuncturedBit+1; (c15)

end (c16)

end (c17)

iCount=0; (c18)

for iParityBit=1:iK (c19)

iCount=iCount+iParityBitsW; (c20)

if(iCount>=1K) (c21)

iaDepuncturedW(iParityBit)=iaPuncturedSoftParity (iPuncturedBit); (c22)

iCount=iCount-iK; (c23)

iPuncturedBit=iPuncturedBit+1; (c24)

end (c25)

end (c26)

In the above example function, lines (c1) and (c2) name the function, and lines (c3) to (c7) define the variables used in the function. Lines (c8) to (c17) define a first counting loop that produces the Y parity bit stream 750, and lines (c18) to (c26) define a second counting loop that produces the W parity bit stream 760. In one example, the depuncturing algorithm inserts "soft zeros," indicating that no information is available for that particular bit position, for all "erasures," namely, for those bits removed by the puncturing algorithm in the FEC encoder 100. As discussed above with reference to the example puncturing algorithm, those skilled in the art will recognize, given the benefit of this disclosure, that numerous variations on and modifications to the above example depuncturing algorithm may be made to accommodate different scenarios and designs.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A processor-implemented method of puncturing a digital data stream to generate an output punctured bit stream, the digital data stream comprising a first parity bit stream and a second parity bit stream, each of the first and second parity bit streams consisting of K bits, the method comprising steps of:
   selecting up to K bits from the first parity bit stream by operating a first counting loop to provide a first selected number of bits;
   determining whether the first selected number of bits is less than a predetermined desired number of bits for the output punctured bit stream; and
   selecting, responsive to a determination that the first selected number of bits is less than the predetermined desired number of bits, a second selected number of bits from the second parity bit stream such that a sum of the first selected number of bits and the second selected number of bits is equal to the predetermined desired number of bits for the output punctured bit stream;
   wherein operating the first counting loop includes:
   defining a first number of bits desired to be selected from the first parity bit stream as the lesser of K and the predetermined desired number of bits for the output punctured bit stream;
   incrementing a counter by a counter step value equal to the first number of bits to set a counter value;
   based on the counter value, selecting another a bit from the first parity bit stream;
   decrementing the counter by K; and
   repeating the steps of incrementing the counter, selecting another the bit from the first parity bit stream, and decrementing the counter, until the first selected number of bits is equal to the lesser of K and the predetermined desired number of bits for the output punctured bit stream.

2. The method as claimed in claim 1, wherein selecting the second selected number of bits includes operating a second counting loop to select the second selected number of bits from the second parity bit stream.

3. A processor-implemented method of puncturing a coded digital data stream
   comprising a first parity bit stream and a second parity bit stream to generate an output punctured bit stream, the first and second parity bit streams each consisting of K bits and the output punctured bit stream consisting of N-K bits, the method comprising: receiving the first and second parity bit streams;
   operating a first counting loop to select a first number of selected bits from the first parity bit stream, the first number of selected bits being the lesser of K and N-K, including;
   initializing the first counting loop with a first counter value;
   defining a first counter step value equal to the lesser of K and N-K;
   incrementing the first counter value by the first counter step value to set an incremented counter value;
   based on the incremented counter value, selecting a parity bit from the first parity bit stream;
   decrementing the first counter by K; and
   repeating the steps of incrementing the first counter, selecting the parity bit, and decrementing the first counter, to select the first number of selected bits;
   determining whether the first number of selected bits is less than N-K; responsive to a determination that the first number of selected bits is less than N-K, operating a second counting loop to select a second number of selected bits from the second parity bit stream until the sum of the first number of selected bits and the second number of selected bits is equal to N-K; and
   transmitting the output punctured bit stream.

4. The method as claimed in claim 3, wherein initializing the first counting loop includes initializing the first counting loop with the first counter value equal to zero.

5. The method as claimed in claim 3, wherein operating the second counting loop includes:
   initializing the second counting loop with a second counter value;
   defining a second counter step value equal to the difference between N-K and the first number of selected bits;
   incrementing the second counter value by the second counter step value to set a second incremented counter value;
   based on the second incremented counter value, selecting a parity bit from the second parity bit stream;
   decrementing the second counter by K; and
   repeating the steps of incrementing the second counter, selecting the parity bit, and decrementing the second counter to select the second number of selected bits.

6. The method as claimed in claim 5, wherein initializing the second counting loop includes initializing the second counting loop with the second counter value equal to zero.

7. A processor-implemented method of generating a forward error corrected punctured digital data stream, the method comprising: receiving an input bit stream; encoding the input bit stream using a forward error correcting encoder to generate a coded bit stream, the coded bit stream comprising a first parity bit stream, a second parity bit stream, and a systematic bit stream;
   operating a first counting loop to puncture the first parity bit stream to generate a first punctured parity bit stream;
   comparing a first number of parity bits in the first punctured parity bit stream with a desired number of parity bits for the forward error corrected punctured digital data stream;
   responsive to the first number of parity bits being les than the desired number of bits, operating a second counting loop to puncture the second parity bit stream to generate a second punctured parity bit stream having a second number of parity bits equal to the difference between the desired number of parity bits and the first number of parity bits;
   combining the systematic bit stream, the first punctured parity bit stream and second punctured parity bit stream to generate the forward error corrected punctured digital data stream; and
   transmitting the forward error corrected punctured digital data stream;
   wherein operating the first counting loop includes:
   initializing the first counting loop with a first counter value;

defining a first counter step value equal to the lesser of the number of bits in the first parity bit stream and the desired number of parity bits for the forward error corrected punctured digital data stream;

incrementing the first counter value by the first counter step value; based on the first counter value, selecting a parity bit from the first parity bit stream;

decrementing the first counter by the number of bits in the first parity bit stream; and repeating the steps of incrementing the first counter, selecting the parity bit, and decrementing the first counter, to select the first number of parity bits and generate the first punctured parity bit stream.

8. The method as claimed in claim 7, wherein operating the second counting loop includes:

initializing the second counting loop with a second counter value; defining a second counter step value equal to the equal to the difference between the desired number of parity bits for the forward error corrected punctured digital data stream and the first number of parity bits;

incrementing the second counter value by the second counter step value;

based on the second counter value, selecting a parity bit from the second parity bit stream;

decrementing the second counter by the number of bits in the second parity bit stream; and repeating the steps of incrementing the second counter, selecting the parity bit, and decrementing the second counter, to select the number of parity bits and generate the second punctured parity bit stream.

9. The method as claimed in claim 8, wherein initializing the first counting loop includes initializing the first counting loop with the first counter value equal to zero.

10. The method as claimed in claim 9, wherein initializing the second counting loop includes initializing the second counting loop with the second counter value equal to zero.

11. A forward error correcting encoder comprising:

a turbo encoder having an input configured to receive an input bit stream consisting of K bits, the turbo encoder being configured to encode the input bit stream to produce a coded bit stream comprising a systematic bit stream consisting of K bits, a first parity bit stream consisting of K bits and a second parity bit stream consisting of K bits, K being an integer; and a puncturing apparatus coupled to the turbo encoder and configured to receive at the first and second parity bit streams and to execute a puncturing algorithm to produce a punctured parity bit stream consisting of N-K bits, N being an integer greater than K, the puncturing algorithm comprising a conditional counting loop that selects a first number of selected bits equal to the lesser of K and N-K bits from the first parity bit stream and, if the first number of selected bits is less than N-K, selects a remaining number of selected bits from the second parity stream to generate the punctured parity bit stream consisting of N-K bits$_1$ wherein the puncturing apparatus is further configured to execute the puncturing algorithm comprising of:

setting a first counter value to zero; defining a first counter step value equal to the lesser of K and N-K;

incrementing the first counter value by the first counter step value to set a first incremented counter value;

based on the first incremented counter value, selecting a parity bit from the first parity bit stream;

decrementing the first counter by K; and repeating the steps of incrementing the first counter, selecting a parity bit from the first parity bit stream, and decrementing the first counter until the first number of selected bits is equal to the lesser of K and N-K bits.

12. The forward error correcting encoder as claimed in claim 11, further comprising a coded bit stream formation apparatus configured to combine the systematic bit stream with the punctured parity bit stream to generate an output punctured coded bit stream for transmission.

13. The forward error correcting encoder as claimed in claim 11, wherein the forward error correcting encoder is implemented as a field programmable gate array.

14. The forward error correcting encoder as claimed in claim 11, wherein the puncturing apparatus is further configured to execute the puncturing algorithm comprising steps of:

determining whether the first number of selected bits is less than N-K; and responsive to a determination that the first number of selected bits is less than N-K, performing steps of:

setting a second counter value to zero;

defining a second counter step value equal to the difference between N-K and the first number of selected bits;

incrementing the second counter value by the second counter step value to set a second incremented counter value;

based on the second incremented counter value, selecting a parity bit from the second parity bit stream;

decrementing the second counter by K; and repeating the steps of incrementing the second counter, selecting a parity bit from the second parity bit stream, and decrementing the second counter until the sum of the first number of selected bits and the remaining number of selected bits is equal to N-K.

* * * * *

UNITED STATES PATENT AND TRADEMARK OFFICE
CERTIFICATE OF CORRECTION

PATENT NO.        : 8,386,902 B1
APPLICATION NO.   : 12/639593
DATED             : February 26, 2013
INVENTOR(S)       : Mark A. Gloudemans It is certified that error appears in the above-identified patent and that said Letters Patent is hereby corrected as shown below:

In the Claims:

In claim 11, column 16, line 6, "$bits_1$" should be replaced with --bits;--.

Signed and Sealed this
Twenty-third Day of April, 2013

Teresa Stanek Rea
*Acting Director of the United States Patent and Trademark Office*